United States Patent
Przybysz et al.

(10) Patent No.: US 10,998,485 B1
(45) Date of Patent: May 4, 2021

(54) COOLER DEVICE WITH SUPERCONDUCTOR SHUNTS

(71) Applicants: John X. Przybysz, Severna Park, MD (US); Robert M. Young, Ellicott City, MD (US); Aaron Ashley Hathaway, Baltimore, MD (US); Edward R. Engbrecht, Odenton, MD (US); Monica P. Lilly, Frederick, MD (US)

(72) Inventors: John X. Przybysz, Severna Park, MD (US); Robert M. Young, Ellicott City, MD (US); Aaron Ashley Hathaway, Baltimore, MD (US); Edward R. Engbrecht, Odenton, MD (US); Monica P. Lilly, Frederick, MD (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/741,341

(22) Filed: Jan. 13, 2020

(51) Int. Cl.
| | |
|---|---|
| *H01L 39/18* | (2006.01) |
| *H01L 39/02* | (2006.01) |
| *H01L 23/00* | (2006.01) |
| *H01L 39/24* | (2006.01) |

(52) U.S. Cl.
CPC .............. *H01L 39/18* (2013.01); *H01L 24/13* (2013.01); *H01L 24/81* (2013.01); *H01L 39/025* (2013.01); *H01L 39/2467* (2013.01); *H01L 39/2493* (2013.01)

(58) Field of Classification Search
None
See application file for complete search history.

(56) References Cited

U.S. PATENT DOCUMENTS

| | | | |
|---|---|---|---|
| 6,581,387 B1 | 6/2003 | Ullom | |
| 2001/0050099 A1* | 12/2001 | Shakouri | H01L 35/10 136/201 |
| 2014/0315723 A1* | 10/2014 | Moyerman | H01L 39/228 505/160 |

(Continued)

OTHER PUBLICATIONS

International Search Report for Application No. PCT/US2020/043394 dated Oct. 29, 2020.

(Continued)

*Primary Examiner* — Cassandra F Cox
(74) *Attorney, Agent, or Firm* — Tarolli, Sundheim, Covell & Tummino LLP (57) ABSTRACT

A solid state cooler device is disclosed that includes a first superconductor shunt, a first normal metal pad disposed on the first superconductor shunt, and a first insulator layer and a second insulator layer disposed on the normal metal pad and separated from one another by a gap. The solid state cooler device also includes a first superconductor pad disposed on the first insulator layer and a second superconductor pad disposed on the second insulator layer, a first conductive pad coupled to the first superconductor pad, and a second conductive pad coupled to the second superconductor pad. Hot electrons are removed from the first normal metal pad when a bias voltage is applied between the first conductive pad and the second conductive pad, wherein the first superconductor shunt facilitates even current distribution through the device.

20 Claims, 9 Drawing Sheets

(56) References Cited

U.S. PATENT DOCUMENTS

2021/0063060 A1     3/2021    Young et al.
2021/0066571 A1     3/2021    Hathaway et al.

OTHER PUBLICATIONS

Herve Courtois et al: "High-performance electronic cooling with superconducting tunnel junctions", Comptes Rendus—Physique., vol. 17, No. 10, Dec. 1, 2016 (Dec. 1, 2016), pp. 1139-1145, XP055738239, FR ISSN: 1631-0705, DOI: 10.1016/j.crhy.2016.08.010 p. 1141, line 31-p. 1144, line 4; figure 2(d).

HQ Nguyen et al: "A robust platform cooled by superconducting electronic refrigerators", Appl. Phys. Lett. Appl. Phys. Lett, Jan. 1, 2015 (Jan. 1, 2015), pp. 12601-12601, XP055738241, Retrieved from the Internet: URL:https://aip.scitation.org/doi/pdf/10.1063/1.4905440 p. 1, right-hand column, line 8-p. 2, right-hand column, line 29; figure 1.

Nguyen HQ et al: "A cascade electronic refrigerator using superconducting tunnel junctions", arxiv.org, Cornell University Library, 201 Olin Library Cornell University Ithaca, NY 14853, May 3, 2016 (May 3, 2016), XP080699075, figure 1.

Ian Jasper Agulo et al: "Effective electron microrefrigeration by superconductor-insulator-normal metal tunnel junctions with advanced geometry of electrodes and normal metal traps; Effective electron microrefrigeration by SIN tunnel junctions with advanced geometry of electrodes and normal metal traps", Nanotechnology, Institute of Physics Publishing, GB, vol. 15, No. 4, Apr. 1, 2004 (Apr. 1, 2004), pp. S224-S228, XP020067898, ISSN: 0957-4484, DOI: 10.1088/0957-4484/15/4/020 figures 1,2.

Camarasa-Gomez M et al: "Superconducting cascade electron refrigerator", Applied Physics Letters, A I P Publishing LLC, US, vol. 104, No. 19, May 12, 2014 (May 12, 2014), XP012185456, ISSN: 0003-6951, DOI: 10.1063/1.4876478 [retrieved on Jan. 1, 1901] the whole document.

International Search Report for Application No. PCT/US2020/043398 dated Nov. 12, 2020.

Clark A M et al: "Practical electron-tunneling refrigerator", Applied Physics Letters, A I P Publishing LLC, US, vol. 84, No. 4, Jan. 26, 2004 (Jan. 26, 2004), pp. 625-627, XP012061945, ISSN: 0003-6951, DOI: 10.1063/1.1644326 figure 1.

Leoni R et al: "Electron cooling by arrays of submicron tunnel junctions", Journal of Applied Physics, American Institute of Physics, US, vol. 85, No, 7, Apr. 1, 1999 (Apr. 1, 1999), pp. 3877-3881, XP012047026, ISSN: 0021-8979, DOI: 10.1063/1.369759 figures 2,3.

Prest M J et al: "Strain enhanced electron cooling in a degenerately doped semiconductor", Applied Physics Letters, A I P Publishing LLC, US, vol. 99, No. 25, Dec. 19, 2011 (Dec. 19, 2011), pp. 251908-251908, XP012152781, ISSN: 0003-6951, DOI: 10.1063/1.3670330 [retrieved on Dec. 22, 2011].

Muhonen, et al., "Micrometer-Scale Refrigerators" (2012); Reports on progress in physics. Physical Society (Great Britain). 75.046501. 10.1088/0034-4885/75/4/046501; found on the internet at: file:///C:/Users/lpringle/Downloads/Micrometre-scale_refrigerators.pdf on Aug. 28, 2019.

Nguyen, et al. "A Cascade Electronic Refirgerator Using Superconducting Tunnel Junctions" (May 3, 2016); Phys. Ref. Applied 6, 054011 (2016); DOI: 10.1103/PhysRevApplied.6.054011; arXiv:1605.00830 [cond-mat.mes-hall]; found on the internet at: https://arxiv.org/abs/1605.00830 on Aug. 28, 2019.

Nguyen, et al. "Trapping Hot Quasi=Particles in a High-Power Superconducting Electronic Cooler"; New Journal of Physics. 15. 10.1088/1367-2630/15/8/085013; found on the internet at: https://www.researchgate.net/publication/236124442_Trapping_hot_quasi-particles_in_a_high-power_superconducting_electronic_cooler, on Aug. 28, 2019.

International Search Report for Application No. PCT/US2020/053789 dated Jan. 15, 2021.

Quarnta O et al. "Cooling electrons from 1 K to 400 mK with V-based nanorefrigerators" ARXIV.Org, Cornell University Library, 201 Olin Library Cornell University Ithaca, NY 14853, Nov. 2, 2010, XP080460092, DOI: 10.1063/1.3544058, figure 1.

* cited by examiner

FIG. 1

Streamline: Current density

FIG. 2

Streamline: Current density

COOLER DEVICE WITH SUPERCONDUCTOR SHUNTS

TECHNICAL FIELD

The present invention relates generally to refrigeration, and more particularly to a cooler device with superconductor shunts.

BACKGROUND

Solid-state electron cooling by the tunneling of "hot" electrons across a normal metal-insulator-superconductor (NIS) junction, using a bias voltage, has been proven to work below 1 K, substantially operating like the more familiar near room-temperature Peltier thermo-electric refrigerator. These NIS cryo-coolers are built from the same materials as Josephson junctions used in the superconducting circuitry and by the same lithography fabrication foundry tools, and are fundamentally completely compatible with the Josephson junction components. They could be integrated alongside the Josephson junctions themselves, fabricated concurrently. However, currently NIS coolers have a very limited temperature throw, with a maximum temperature difference between hot and cold sides of ~150 mK.

One of the main limitations to NIS coolers' full performance is the presence in the superconducting leads of non-equilibrium quasi-particles arising from the high current running through the device. The low quasi-particle relaxation rate and thermal conductivity in a superconductor bind these hot particles in the vicinity of the junction and lead to severe overheating in the superconducting electrodes. There are several methods for reducing the accumulation of quasi-particles in a superconductor. The most common method is to use a normal metal coupled to the superconductor referred to as a quasiparticle trap, such that quasi-particles migrate to the normal metal and relax their energy there through electron-electron and electron-phonon interaction. This device is referred to as a normal metal-insulator-superconductor-normal metal (NISN) junction.

SUMMARY

In one example, a solid state cooler device is provided that comprises a first superconductor shunt, a first normal metal pad disposed on the first superconductor shunt, and a first insulator layer and a second insulator layer disposed on the normal metal pad and separated from one another by a gap. The solid state cooler device further comprises a first superconductor pad disposed on the first insulator layer and a second superconductor pad disposed on the second insulator layer, a first conductive pad coupled to the first superconductor pad, and a second conductive pad coupled to the second superconductor pad. Hot electrons are removed from the first normal metal pad when a bias voltage is applied between the first conductive pad and the second conductive pad, wherein the first superconductor shunt facilitates even current distribution through the device.

In another example, a method of fabricating a solid state cooler device is provided. The method comprises forming a first superconductor shunt on or in a first substrate, forming a first normal metal pad over the first superconductor shunt, forming an insulator layer over the first normal metal pad, and forming a superconductor layer over the insulator layer. The method further comprises forming a patterned mask over the superconductor layer, and performing an etch process to remove portions of the superconductor layer, and the insulator layer based on the patterned mask to form a first normal metal-insulator-superconductor (NIS) junction that incudes the first normal metal pad, a first insulator layer overlying the first normal metal pad, and a first superconductor pad overlying the first insulator layer, and a second NIS junction that includes the first normal metal pad, a second insulator layer overlying the first normal metal pad, and a second superconductor pad overlying the second insulator layer, wherein the first and second NIS junctions are separated from one another by a gap.

DETAILED DESCRIPTION

The disclosure relates to a solid state cooler device that includes a plurality of NIS or NISN junctions in which a superconductor shunt layer is disposed on the surface of the normal layer (N) of the NIS or both normal layers of NISN devices that forms the junctions. The superconductor shunt layer shunts current from the normal metal layer by providing a lower resistance path. The currents that would flow in the normal metal instead flow through the superconductor shunt layer and eliminate the ohmic losses associated with the normal metal layers. Therefore, the superconductor acts to prevent $I^2*R$ losses in the normal metal improving the overall efficiency of the NIS cooler.

The current distribution through the junction is important because the junction is designed to operate at a particular $A/cm^2$. If the current passing through a junction concentrates into a smaller area then the local $A/cm^2$ is higher than designed with the result that the junction is driven normal and begins producing heat. The current distribution through the bump bonds is also of concern because they are sized for a particular current and when that current increases then they also begin producing heat. Therefore, having superconductor shunts on the normal layers of the NIS junction or both normal layers of the NISN junctions prevents uneven current distribution through the bump bonds and prevents the current from concentrating locally as it passes through the junction. The superconductor shunts promote uniform current density through the NIS junctions and the bump bonds to mitigate heat generation due to non-uniform current flow through the NIS junctions.

In some implementations, NIS or NISN junctions are formed using copper as the normal metal. In order for NIS or NISN fabrication to be compatible with current foundry processes the normal metal needs to be deposited before the junction is formed. Therefore, a normal metal needs to be used that is compatible with a superconductor foundry process. These compatible normal metals have very high resistances which will incur large $I^2*R$ losses in the normal metal layer below the tunnel junction in the NIS or NISN Cooler. The superconductor shunt layer provides a low resistance path for the current that runs through the normal metal layer of the NIS or NISN junctions to reduce the $I^2*R$ losses, and promote uniform current density.

In one example, the NIS or NISN junctions each include a normal metal layer formed of titanium tungsten alloy (TiW) or titanium (Ti), an insulator formed of aluminum oxide or some other insulator, and a superconductor layer formed of indium, niobium, aluminum, or some other superconducting metal. A normal metal is a metal that does not superconduct at cryogenic operational device temperatures. It is to be appreciated that the insulator in a NIS or NISN device facilitates controlled band gaps between the normal metal and superconductor material since the relative levels of the bands can vary at the interface of the two materials. This insulator also hinders the return of heat back to the normal metal from the superconductor metal due to the hindering of the return of heat back to the cold normal metal.

Figure 1:
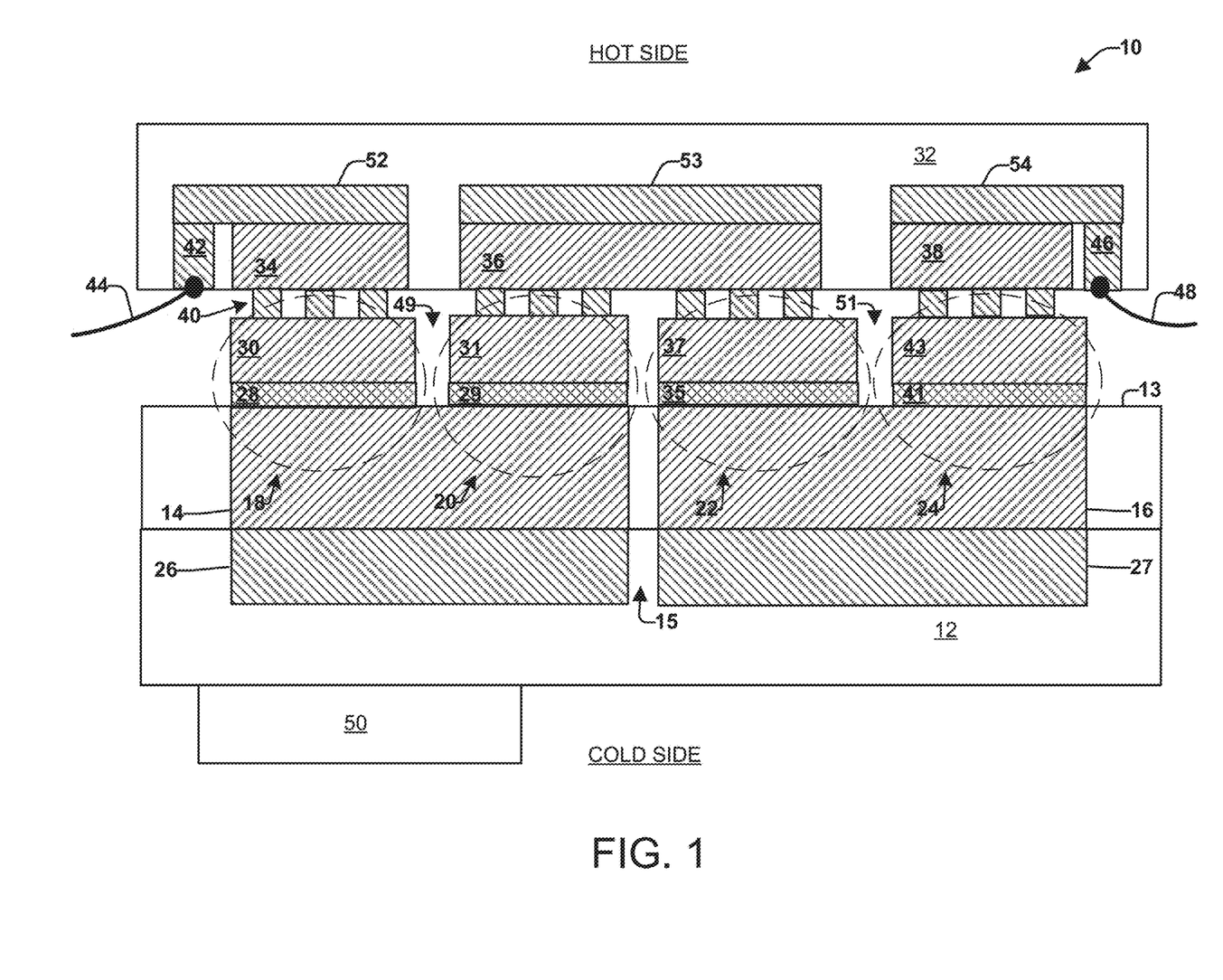
FIG. 1 illustrates a cross-sectional view of a solid state cooler device.

FIG. 1 illustrates a cross-sectional view of an example of a solid state cooler device 10 that employs one or more NIS or NISN devices with superconductor shunt layers to facilitate uniform current density. The solid state cooler device 10 can be configured as a refrigeration stage employed in a cryogenic cooling application in which the solid state structure is one of a plurality of solid state cooler devices disposed about a refrigeration container that resides in a vacuum and holds superconducting circuitry. The plurality of solid state structures can provide the final stage in a cryogenic refrigeration system, and allow for efficient cooling by removal of heat from a cold side of the refrigeration stage, and prevent the return of heat from the hot side of the last refrigeration stage within a plurality of refrigeration stages.

As illustrated in FIG. 1, the solid state cooler device 10 includes a first substrate 12 that is disposed on a cold side of a refrigeration stage, and a second substrate 32 that is disposed on a hot side of the refrigeration stage. The first substrate 12 can be a first chip containing superconducting circuitry and the second substrate 32 can be a second chip containing conventional or superconducting circuitry. Alternatively, the first and second substrates 12 and 32 can be a solid block of material such as a semiconductor or an insulator. A first superconductor shunt layer 26 is disposed within the first substrate 12 and a second superconductor shunt layer 27 is disposed within the first substrate 12 adjacent the first superconductor shunt layer 26 and separated by a gap 15. A first normal metal pad 14 is disposed on a top side of the first superconductor shunt layer 26, and a second normal metal pad 16 is disposed on a top side of the superconductor shunt layer 27. The first normal metal pad 14 and the second normal metal pad 16 are disposed in a dielectric layer 13, and formed of a normal metal, such as titanium tungsten (TiW) or titanium (Ti). The first superconductor shunt layer 26 and the second superconductor shunt layer 27 can be formed of a superconductor material such as niobium (Nb). A temperature sensor 50 resides on a bottom side of the first substrate 12 and can be formed of ruthenium oxide.

A first insulator layer 28 is disposed on a first end of the first normal metal pad 14 and a second insulator layer 29 is disposed on a second end of the first normal metal pad 14 separated from one another by a gap 49. A third insulator layer 35 is disposed on a first end of the second normal metal pad 16 and a fourth insulator layer 41 is disposed on a second end of the second normal metal pad 16 separated from one another by a gap 51. In one example, the first, second, third and fourth insulator layers are formed of aluminum oxide. The first insulator layer 28 is capped with a first superconductor pad 30, the second insulator layer 29 is capped with a second superconductor pad 31, the third insulator layer 35 is capped with a third superconductor pad 37, and the fourth insulator layer 41 is capped with a fourth superconductor pad 43.

The first, second, third and fourth insulator layers 28, 29, 35 and 41 are selected to have a thickness (e.g., about 9 Angstroms) thick enough to provide an insulator for a NIS or NISN tunnel junction. The first normal metal pad 14, the first insulator layer 28, and the first superconductor pad 30 form a first NIS junction 18. The first normal metal pad 14, the second insulator layer 29 and the second superconductor pad 31 form a second NIS junction 20. The second normal metal pad 16, the third insulator layer 35 and the third superconductor pad 37 form a third NIS junction 22, and the second normal metal pad 16, the fourth insulator layer 41 and the fourth superconductor pad 43 form a fourth NIS junction 24.

Each of the first, second, third and fourth NIS junctions 18, 20, 22 and 24 are coupled to the second substrate 32 through a plurality of conductive contacts 40 (e.g., normal metal such as gold) to a plurality of conductive pads (e.g., gold pads). Although the first, second, third and fourth NIS junctions 18, 20, 22 and 24 are illustrated as being above the first substrate 12, the first, second, third and fourth NIS junctions 18, 20, 22 and 24 or a portion thereof could be emedded within the first substrate 12. The plurality of conductive contacts 40 can be a plurality of bump bonds that function to both transport electrical current and heat along with functioning as a mechanical bond of the first substrate 12 to the second substrate 32.

A first conductive pad 34 resides in the second substrate 32 and is coupled to the first superconductor pad 30 via a first set of conductive contacts. The first conductive pad 34 can function as a quasi-particle trap for the first NIS junction 18 to form a first NISN junction. A second conductive pad 36 resides in the second substrate 32 and has a first end coupled the second superconductor pad 31 via a second set of conductive contacts, and the second end of the second conductive pad 36 is coupled to the third superconductor pad 37 via a third set of conductive contacts. A third conductive pad 38 resides in the second substrate 32 and is coupled to the fourth superconductor pad 43 via a fourth set of conductive contacts.

A third superconductor shunt layer 52 is disposed over the first conductive pad 34, a fourth superconductor shunt layer 53 is disposed over the second conductive pad 36, and a fifth superconductor shunt layer 54 is disposed over the third conductive pad 38. The third superconductor shunt layer 52 has a first overhang region that extends beyond the first conductive pad 34, and the fifth superconductor shunt layer 54 has a second overhang region that extends beyond the third conductive pad 38. A first contact terminal 42 is embedded in the second substrate 32 and coupled to a first overhang region of the third supercondcutor shunt layer 52 and also connected to a first electrical wire 44. A second contact terminal 46 is embedded in the second substrate 32 and coupled to a second overhang region of the fifth superconductor shunt layer 54, and also connected to a second electrical wire 48. Alternatively, the first conductive pad 34, the second conductive pad 36, and the third conductive pad 38 (and 42 and 46) can overlay the second substrate 32.

In operation, a bias voltage is applied between the first electrical wire 44 and the second electrical wire 48 causing a current to flow from the first contact terminal 42 to the second contact terminal 46. That is the current flows from the first contact terminal 42 through the third superconductor shunt layer 52, the first conductive pad 34, the first NIS junction 18, the first superconducting shunt layer 26, the second NISN junction 20, the second conductive pad 36, the fourth superconductor shunt layer 54, back through the second conductive pad 36, the third NISN junction 22, the second superconducting shunt layer 27, the fourth NISN junction 24, the third conductive pad 38, the fifth superconductor shunt layer 56 to the second contact terminal 46. The bias voltage raises the energy level of the hot electrons and the hot holes on the first normal metal pad 14 and the second normal metal pad 16, where hot electrons above the Fermi level and the hot holes below the Fermi level tunnel across the insulating layers into the superconductor pads to the conductive pads, thus removing heat from the first and second normal metal pads 14 and 16. This provides for a reduction of temperature and an increase delta temperature between the hot side and cold side of the solid state cooler device 10.

The normal metals in the device 10 can be formed of normal metals such as gold, platinum, or a metal that is above its superconducting transition temperature, such as titanium, ruthenium, or chromium, or a combination thereof. The superconducting metals can be formed of a superconductor such as indium, niobium, aluminum, or some other superconducting metal. Although the example of FIG. 1 is shown as having 4 NIS or NISN devices, any multiple of 2 NIS or NISN devices will allow the solid state cooler to operate as described.

Figure 2:
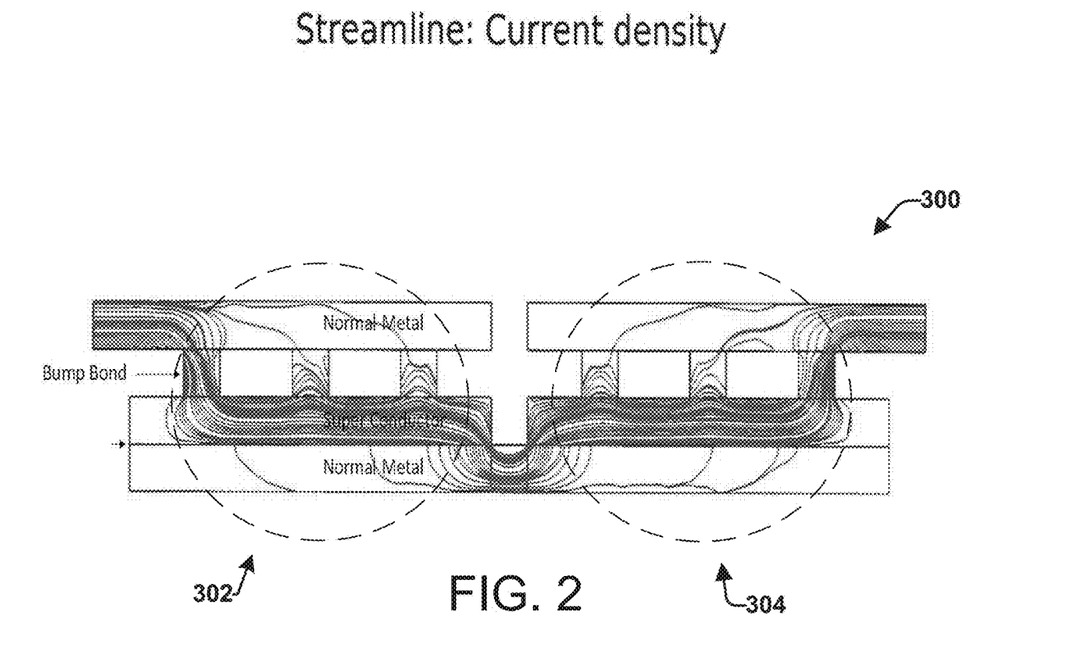
FIG. 2 illustrates a current density flow diagram of a portion of the solid state cooler device without a superconductor shunt.
Figure 3:
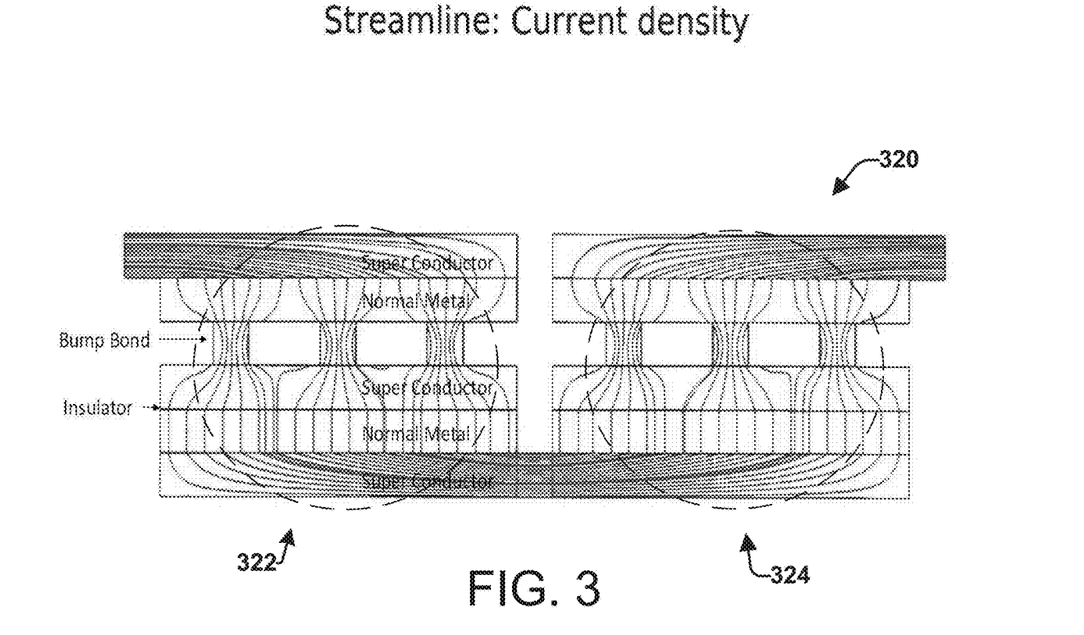
FIG. 3 illustrates a current density flow diagram of a portion of the solid state cooler device with a superconductor shunt.

FIG. 2 illustrates a current density flow diagram 300 of current flowing between a first NISN junction 302 junction and a second NISN junction 304 with top and bottom normal metal pads, while FIG. 3 illustrates current density flow diagram 320 of current flowing between a first NISN junction 322 junction and a second NISN junction 324 with top and bottom superconductor shunts. In FIG. 2, the two junctions 302 and 304 are connected using a normal metal trace top and bottom. The current chooses to follow the path of least resistance, therefore, the majority of the current flows through an incoming end of the top normal metal layer, through a first bump bond closest to the incoming end of the top normal metal layer, through the superconductor layer of the NISN junction and through the connecting end of the bottom normal metal layer connected closest to the second NISN junction. This means that the current doesn't evenly cross the boundary between the top normal metal layer, the superconductor layer, the insulator, and the bottom normal metal layer of either the first or second NISN junctions 302 and 304. The result is inefficiency in the performance of the junctions.

In FIG. 3, the two junctions are connected using a superconductor shunt on the top and bottom of the first and second NISN junctions. FIG. 3 illustrates that the current evenly distributes itself as it moves through the device. That is current evenly distributes through the top superconductor shunt, the top normal metal layer, through the bump bonds, through the superconductor layer, the insulator and normal metal layers of each NISN junctions and finally through the bottom superconductor shunt. This is the result of the superconductor shunts at the top and bottom of each NISN junction. The path of least resistance is through the superconductor shunts allowing for even distribution at all points on the junctions.

Turning now to FIGS. 4-18, fabrication is discussed in connection with formation of the solid state cooler of FIG. 1. Although the present example is illustrated as a first portion and second portion of the solid state cooler being fabricated serially, it is to be appreciated that both portions could be fabricated concurrently or in a reverse order with the second portion being fabricated first and the second portion being fabricated second.

Figure 4:
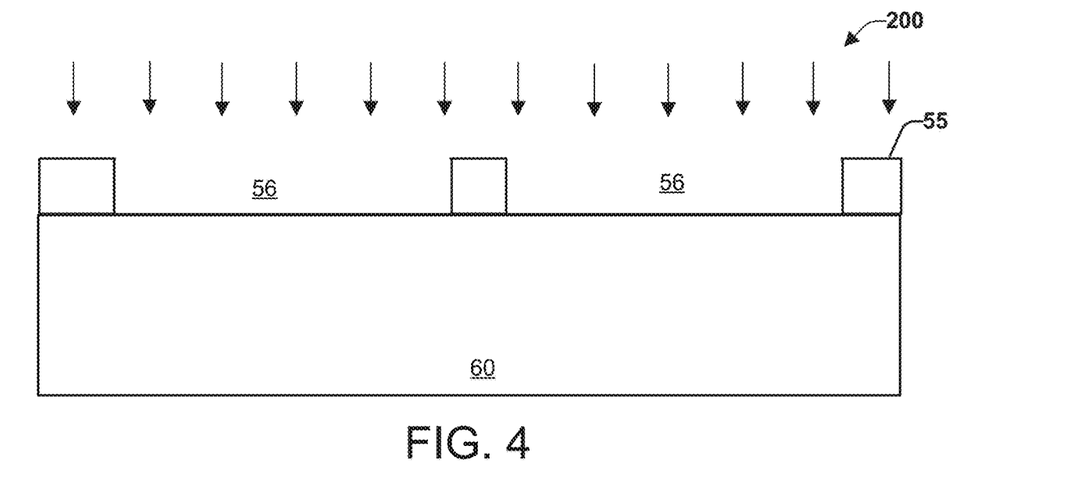
FIG. 4 illustrates a cross-sectional view of a first portion of a solid state cooler in its early stages of fabrication.
Figure 5:
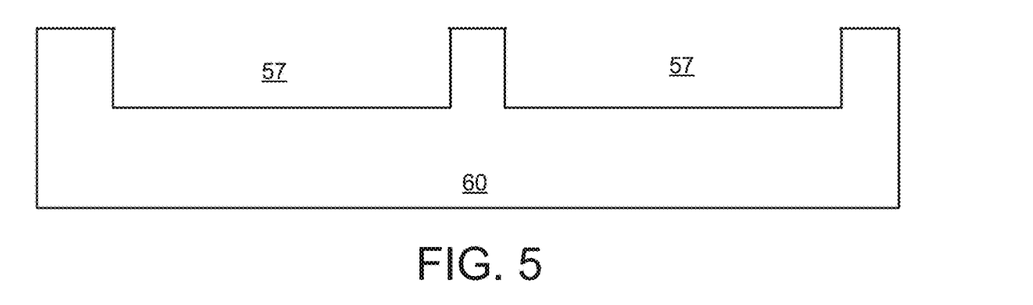
FIG. 5 illustrates a schematic cross-sectional view of the structure of FIG. 4 after undergoing an etch process and stripping of a photoresist material layer.

FIG. 4 illustrates a cross-sectional view of a first portion of a solid state cooler in its early stages of fabrication. A photoresist material layer 55 overlies a first substrate 60 and is patterned and developed to expose openings 56 in the photoresist material layer 55 in accordance with a pattern. The photoresist material layer 55 can have a thickness that varies in correspondence with the wavelength of radiation used to pattern the photoresist material layer 55. The photoresist material layer 55 may be formed over the first substrate 60 via spin-coating or spin casting deposition techniques, selectively irradiated (e.g., via deep ultraviolet (DUV) irradiation) and developed to form openings 56.

Figure 6:
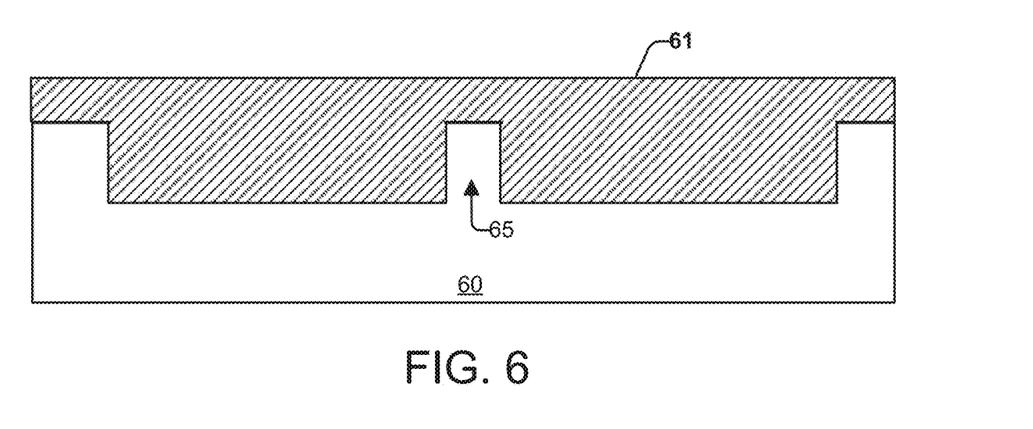
FIG. 6 illustrates a schematic cross-sectional view of the structure of FIG. 5 after undergoing a superconductor deposition process.
Figure 7:
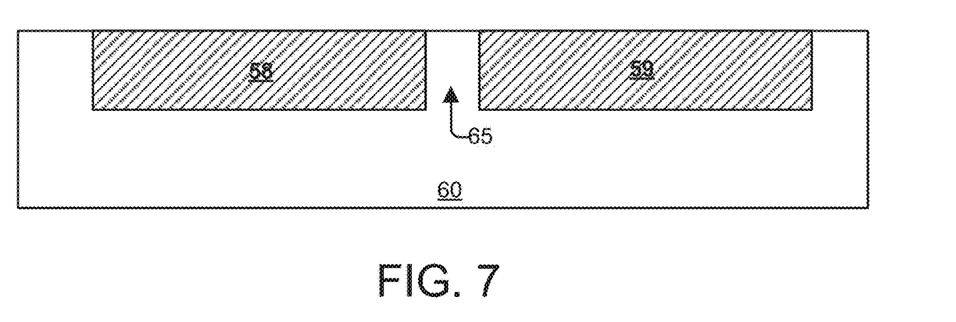
FIG. 7 illustrates a schematic cross-sectional view of the structure of FIG. 6 after undergoing a chemical mechanical polish.

FIG. 4 also illustrates performing of an etch 200 (e.g., anisotropic reactive ion etching (RIE)) on the first substrate 60 to form extended openings 57 (FIG. 5) in first substrate 60 based on the pattern in the photoresist material layer 55. The photoresist material layer 55 is thereafter stripped (e.g., ashing in an $O_2$ plasma) so as to result in the structure shown in FIG. 5. Next, the structure undergoes a contact material fill to deposit superconductor 61 into the openings 57, as illustrated in FIG. 6. The superconductor can be deposited employing a standard contact material deposition. Alternatively, a photoresist lift-off process could be employed. Following deposition of the superconductor, the superconductor material is polished by, for example, a chemical mechanical polish (CMP) down to the surface of the substrate 60 to form a first superconductor shunt 58 adjacent a second superconductor shunt 59 separated by a gap 65, as illustrated in FIG. 7.

Figure 8:
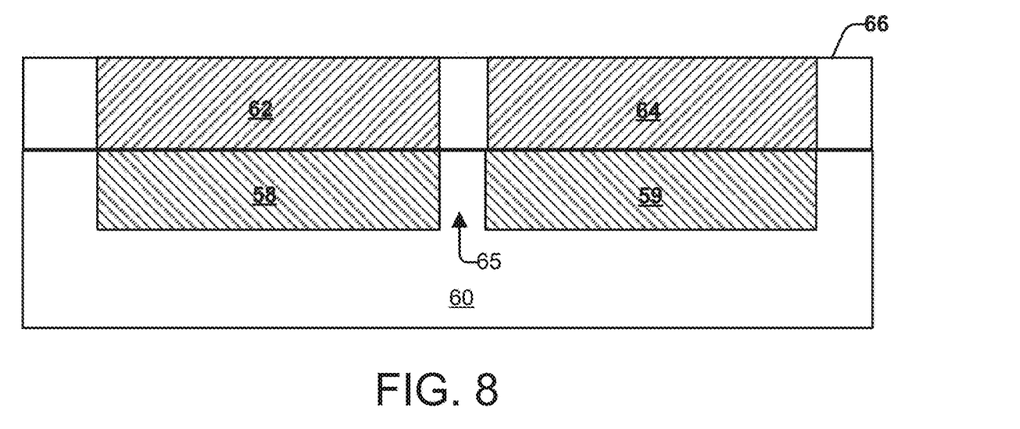
FIG. 8 illustrates a schematic cross-sectional view of the structure of FIG. 7 after formation of normal metal pads in dielectric layer.

Next, a first normal metal pad 62 and a second normal metal pad 64 are disposed within a dielectric layer 66 (e.g., silicon oxide ($SiO_2$)) that collectively reside over a first substrate 60 to form the structure of FIG. 8. The first normal metal pad 62 and the second normal metal pad 64 are formed of a normal metal, such as titanium tungsten alloy (TiW) or titanium (Ti) with the first normal metal pad 62 being disposed above the first superconductor shunt 58, and the second normal metal pad 64 being disposed over the second superconductor shunt 59. The first normal metal pad 62 and the second normal metal pad 64 can be formed by the following: deposition of a dielectric layer 66 onto the substrate 60, a photolithography process of a normal metal layout in a patterned photoresist layer, etching of the normal metal layout into the dielectric layer 66 to form extended openings into the dielectric layer 66 and the stripping of the resist; deposition of normal metal such as chemical vapor deposition of tungsten (W) over a deposited physical vapor deposition titanium (Ti)/titanium nitride (TiN) liner; and a chemical mechanical polish (CMP) process on the normal metal to planarize the normal metal with the dielectric layer 66.

Figure 9:
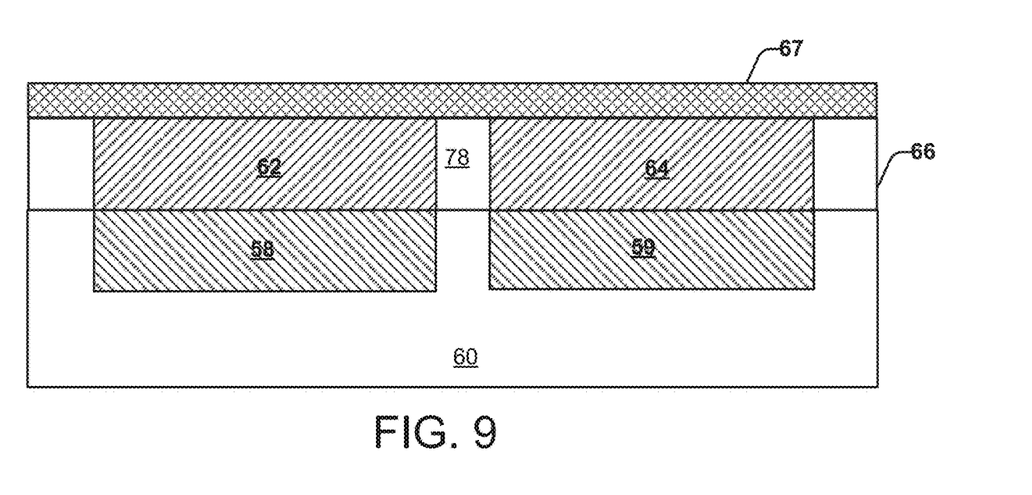
FIG. 9 illustrates a schematic cross-sectional view of the structure of FIG. 8 after an insulator material deposition process.

Next, the structure undergoes a material deposition to form an insulator layer 67 (e.g., aluminum oxide) over the structure of FIG. 8 to provide the resultant structure of FIG. 9. The insulator layer 67 can be deposited employing a standard contact material deposition. Alternatively, an aluminum layer can be deposited and oxidized to form an aluminum oxide layer. The insulator layer 67 should have a thickness of at least 9 Angstroms to function as a tunnel barrier. A superconductor material layer 69 (e.g., niobium) is then deposited over the insulator layer 67 to provide the resultant structure of FIG. 10. The superconductor material layer 69 can be deposited employing a standard contact material deposition.

Figure 10:
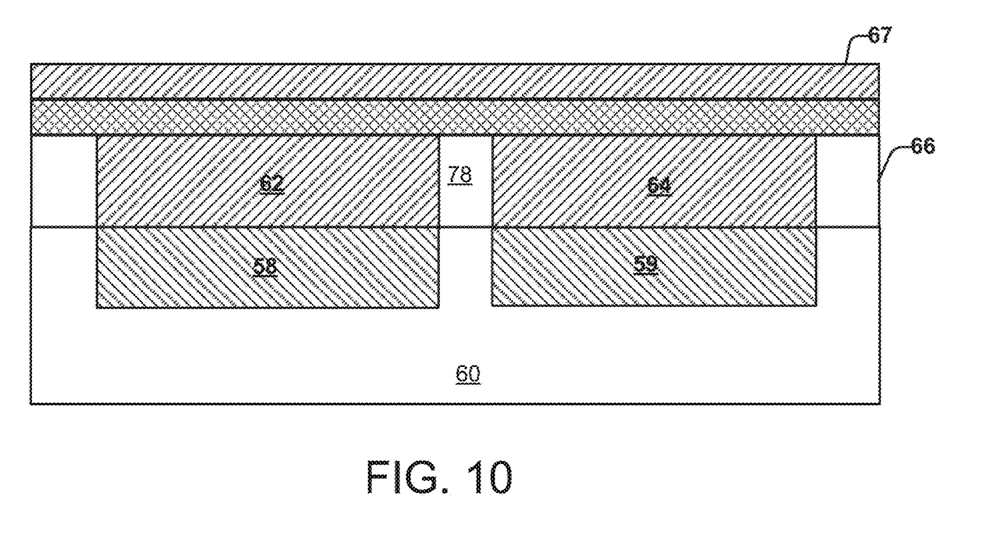
FIG. 10 illustrates a schematic cross-sectional view of the structure of FIG. 9 after a superconductor material deposition process.
Figure 11:
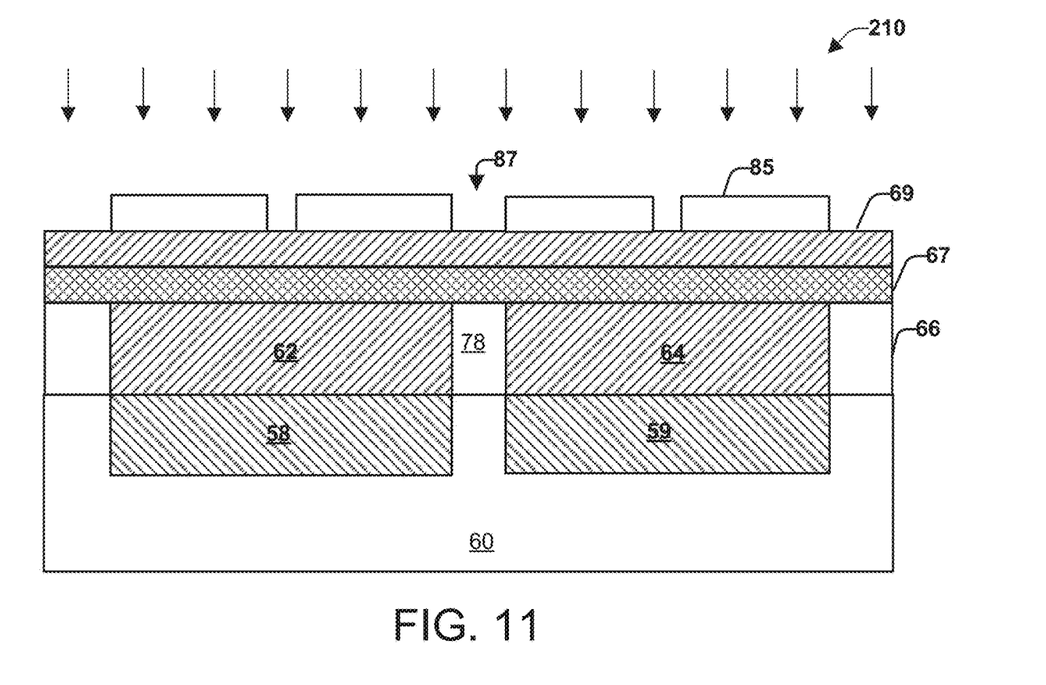
FIG. 11 illustrates a schematic cross-sectional view of the structure of FIG. 10 after a photoresist deposition and patterning process and while undergoing an etch process.

Next, a photoresist material layer 85 is formed over the structure of FIG. 10, and patterned with openings 87 over the superconductor material layer 69 to provide the structure of FIG. 11. An etch process 210 is then performed on the structure of FIG. 11 to extend the patterned openings 87 to the dielectric layer 66, the first normal metal pad 62 and the second normal metal pad 64. The photoresist material layer 85 is then removed to provide the resultant structure of FIG. 12 that includes a first NIS junction 86, a second NIS junction 88, a third NIS junction 90, and a fourth NIS junction 92.

Figure 12:
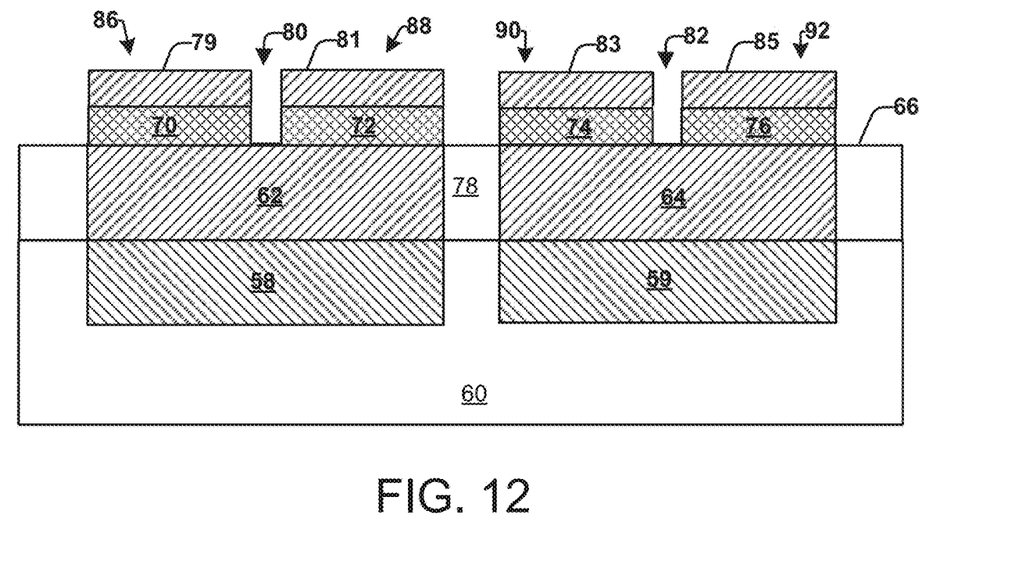
FIG. 12 illustrates a schematic cross-sectional view of the structure of FIG. 11 after the etch process and after stripping of the photoresist material layer.
Figure 13:
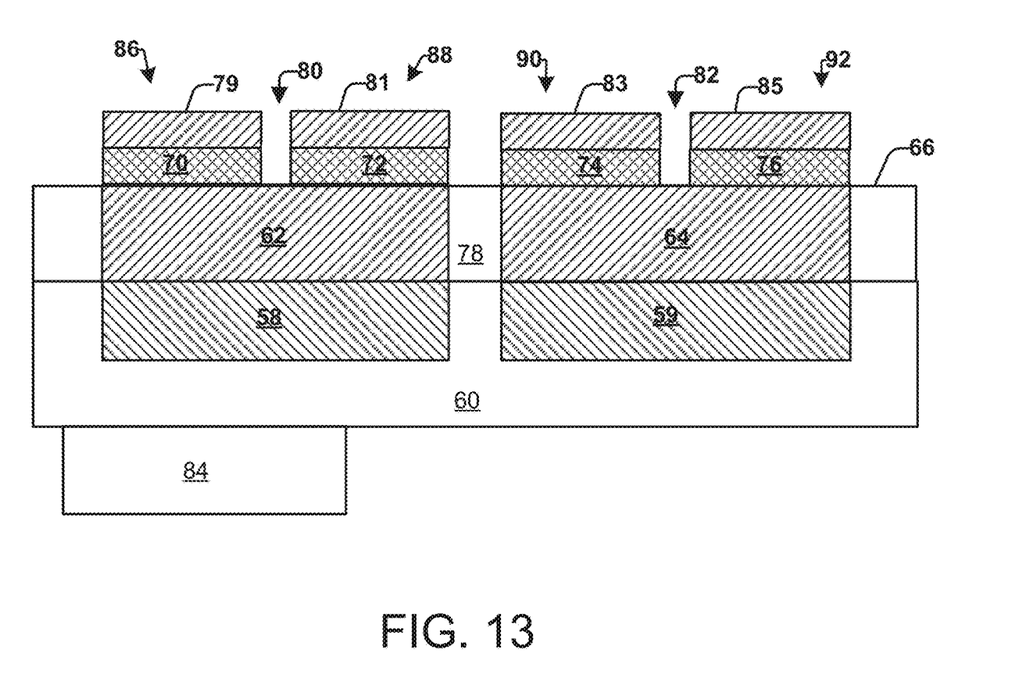
FIG. 13 illustrates a schematic cross-sectional view of the structure of FIG. 12 after a backside thinning process and after formation of a temperature sensor.

The first NIS junction 86 is formed of the first normal metal pad 62, a first insulator layer 70 and a first superconductor pad 79. The second NIS junction 88 is formed of the first normal metal pad 62, a second insulator layer 72 and a second superconductor pad 83. The third NIS junction 90 is formed of the second normal metal pad 64, a third insulator layer 74 and a third superconductor pad 83, and the fourth NIS junction 92 is formed of the second normal metal pad 64, a fourth insulator layer 76 and a fourth superconductor pad 85. The first, second, third and fourth insulator layers 70, 72, 74 and 76 are selected to have a thickness (e.g., about 9 Angstroms) thick enough to provide an insulator for a NIS or NISN tunnel junction.

Next, the backside of the first substrate 60 is thinned down by grinding or a chemical mechanical polish. An optional temperature sensor 84 can be formed on the backside of the first substrate 60 by depositing a layer of ruthenium oxide, which is then covered by a patterned photoresist material, and etched to provide the resultant temperature sensor 84 that resides on a bottom side of the first substrate 60, as illustrate in FIG. 13.

Figure 14:
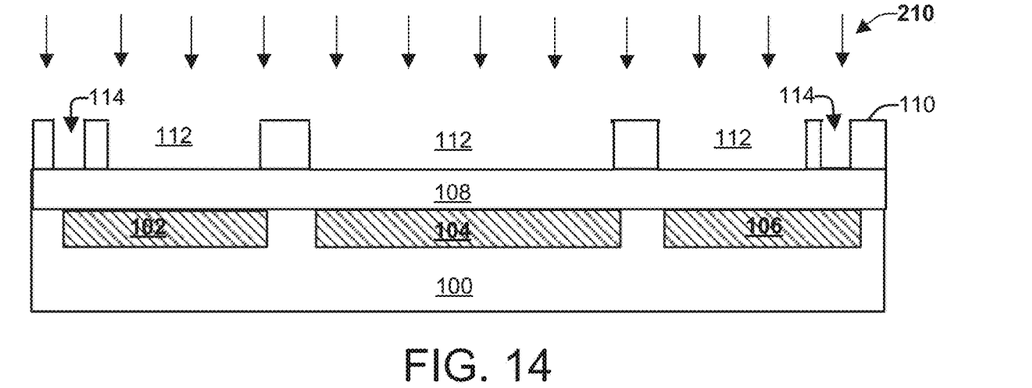
FIG. 14 illustrates a cross-sectional view of a second portion of a solid state cooler in its early stages of fabrication after a photoresist material layer has been deposited and patterned and while undergoing an etching process.
Figure 15:
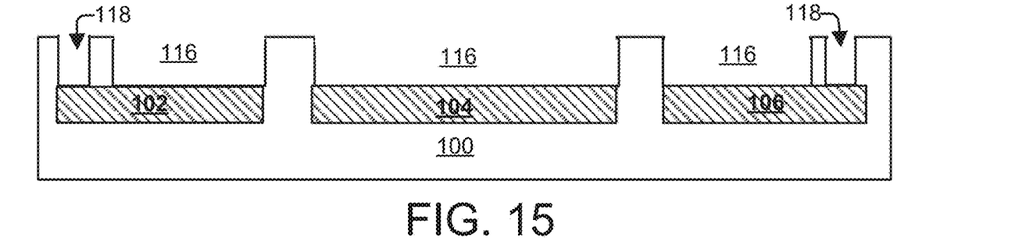
FIG. 15 illustrates a schematic cross-sectional view of the structure of FIG. 14 after the etching process and after the photoresist material layer has been stripped.
Figure 16:
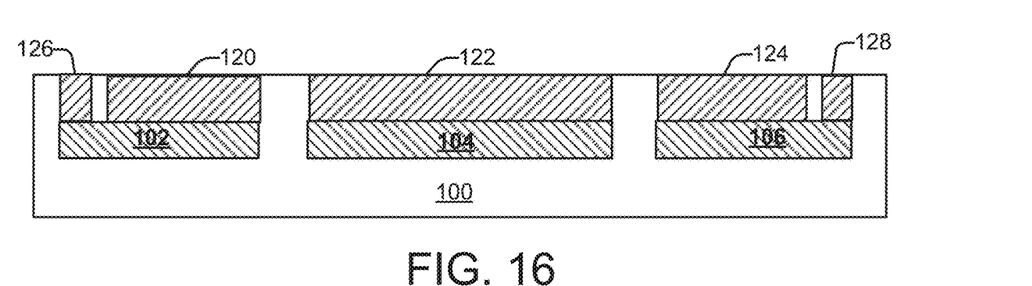
FIG. 16 illustrates a schematic cross-sectional view of the structure of FIG. 15 after a conductive material deposition process.

FIG. 14 illustrates a second portion of a solid state cooler in its early stages of fabrication. A photoresist material layer 110 overlies a dielectric layer 108 that overlies a second substrate 100. The second substrate 100 includes a third superconductor shunt 102, a fourth superconductor shunt 104 and a fifth superconductor shunt 106. FIG. 14 also illustrates performing of an etch 210 (e.g., anisotropic reactive ion etching (RIE)) on the dielectric layer 108 to form extended openings 116 and 118 (FIG. 15) in the dielectric layer 108 based on the pattern in the photoresist material layer 110 to exposed the surface of the third superconductor shunt 102, the fourth superconductor shunt 104 and the fifth superconductor shunt 106. The photoresist material layer 110 is thereafter stripped (e.g., ashing in an $O_2$ plasma) so as to result in the structure shown in FIG. 15.

Next, the structure undergoes a contact material fill to deposit gold into the openings 116 and 118. The gold can be deposited employing a standard contact material deposition. Following deposition of the gold, a first conductive pad 120 spaced apart from a first contact terminal are both formed overlying the third superconductor shunt 102, a second conductive pad 122 is formed overlying the fourth superconductor shunt 104, and a third conductive pad 124 spaced apart from a second contact terminal are both formed overlying the fifth superconductor shunt 106. Alternatively, the processes shown in FIGS. 14-16 can be replaced by a photoresist deposition and patterning, metal evaporation into the patterned openings and an excess metal and photoresist lift-off process.

Figure 17:
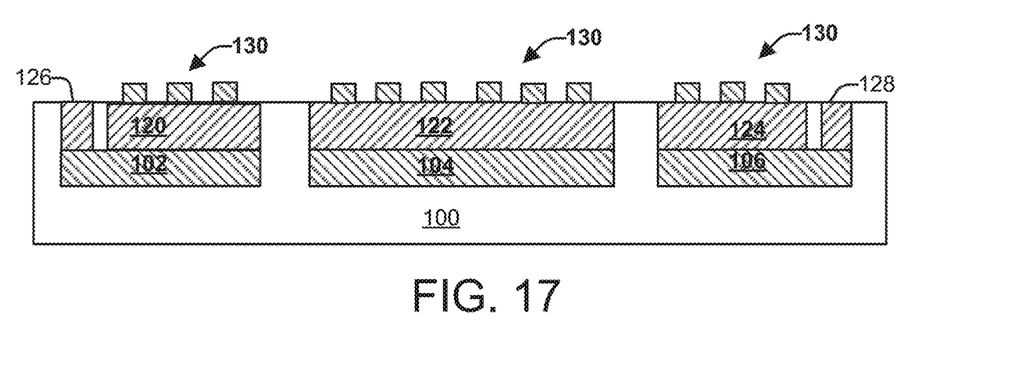
FIG. 17 illustrates a schematic cross-sectional view of the structure of FIG. 16 after formation of conductive contacts.

Next, a plurality of conductive contacts 130 (e.g., bump bonds) are formed on the surface of the first conductive pad 120, the second conductive pad 122 and the third conductive pad 124. The conductive contacts 130 can be either fabricated from a superconducting metal and/or a normal metal. The conductive contacts 130 can be formed using a standard liftoff process or through etching. Alternatively, the conductive contacts could be deposited. The conductive contacts can be formed on either the conductive pads as shown or on the superconductor pads of FIG. 13.

Figure 18:
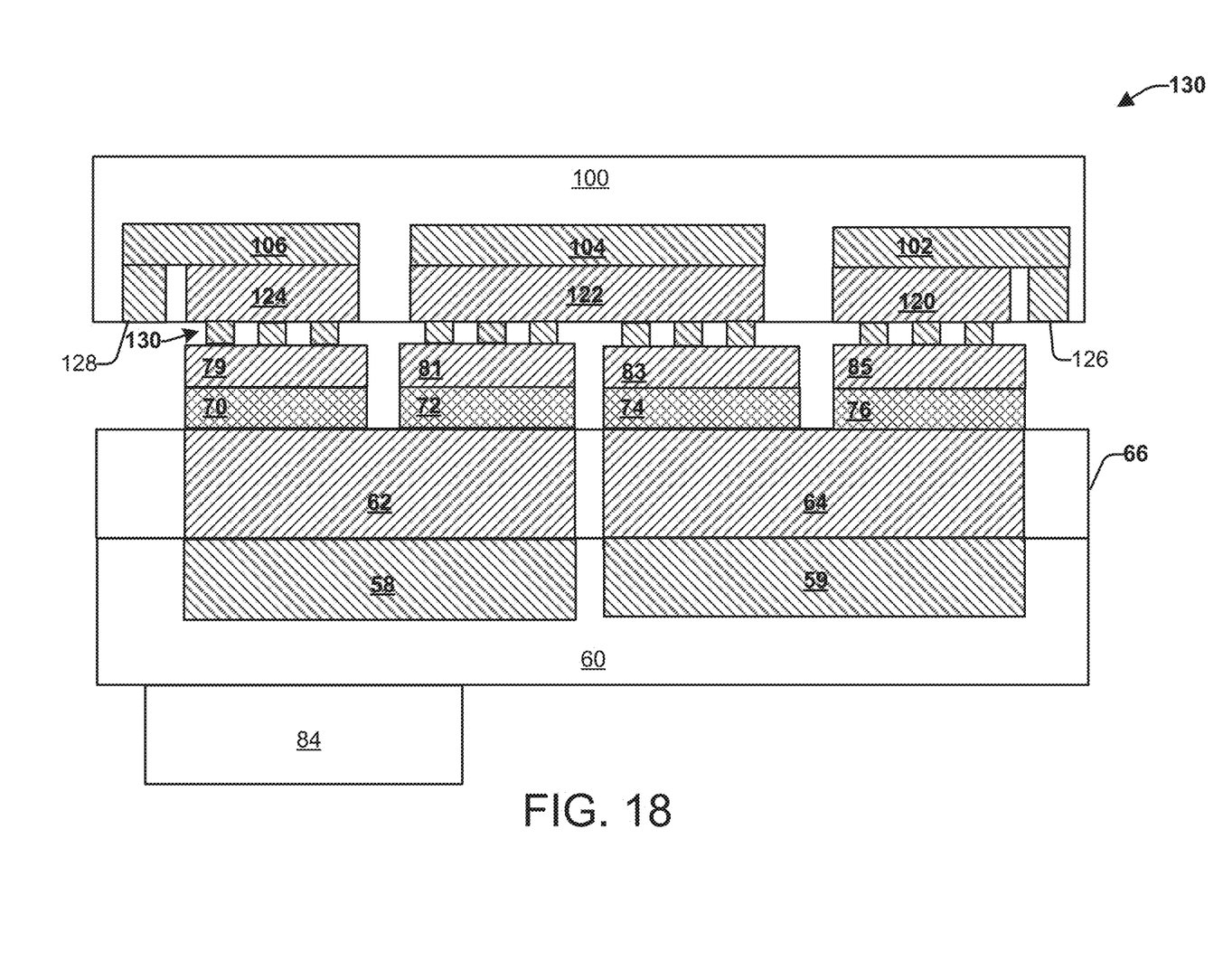
FIG. 18 illustrates formation of a solid state cooler by flipping and bonding the second portion of the cooler of FIG. 17 onto the first portion of the cooler of FIG. 13.

The second substrate 100 is then flipped and disposed over the first substrate 60 and bonded, such that the third conductive pad 124 is aligned and coupled to the first superconductor pad 79, a first end of the second conductive pad 122 is aligned and coupled to the second superconductor pad 81, a second end of the second conductive pad 122 is aligned and coupled to the third superconductor pad 83, and the first conductive pad 120 is aligned and coupled to the fourth superconductor pad 85. The resultant structure is illustrated in FIG. 18.

Figure 19:
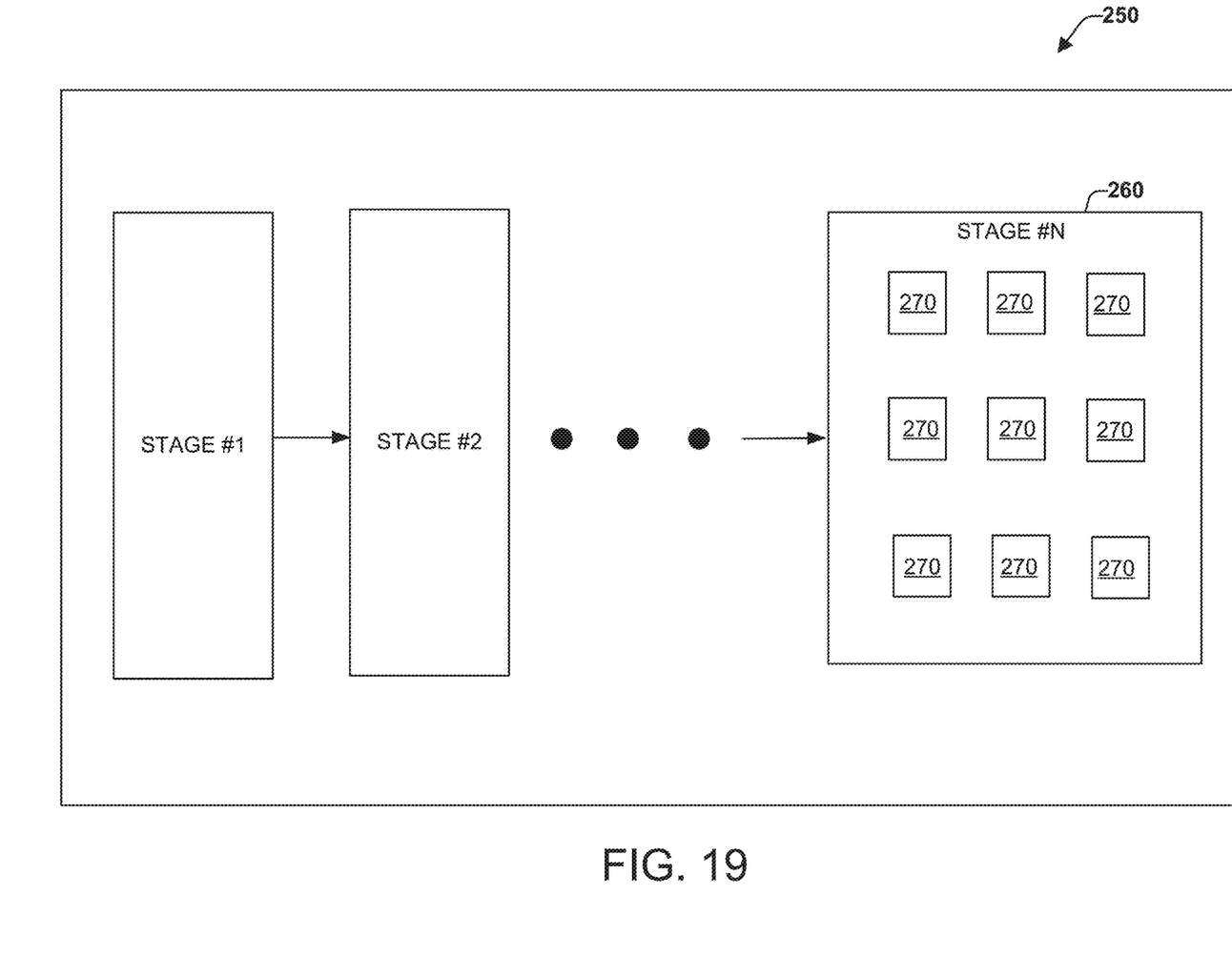
FIG. 19 illustrates a block diagram of a refrigeration system that employs solid state devices such as the solid state device of FIG. 1

FIG. 19 illustrates a block diagram of a refrigeration system 250 that employs solid state devices such as the solid state device 10 of FIG. 1. The refrigeration system 250 includes a plurality of stages labeled stage #1 to stage #N, where N is an integer greater than or equal to 2. Each refrigeration stage provides an additional temperature drop from the previous stage, such that the Nth stage is the final stage and provides the last temperature drop and lowest temperature of the refrigeration system 250. In other examples, the Nth stage is a first or intermediary stage as opposed to the last stage. Stage #N in the refrigeration system 250 includes a refrigeration container 260 with a plurality of solid state devices 270 similar to that illustrated in FIG. 1 disposed about the container and cooperating to provide the final lowest temperature of the refrigeration system 250 within the container 260. The container 260 can be in a vacuum environment and be configured to house superconducting circuitry. In another example, one or more of the other stages employ solid state devices similar to those in stage #N to provide incremental temperature drops across the refrigeration system 250. In other examples, the refrigeration container 260 can be formed of a normal metal that provides the final normal metal layer of each solid state device 270.

For purposes of simplification of explanation the terms "overlay", "overlaying", "overlying", "underlay" and "underlying" (and derivatives) are employed throughout this disclosure to denote a relative position of two adjacent surfaces in a selected orientation. Additionally, the terms "top" and "bottom" employed throughout this disclosure denote opposing surfaces in the selected orientation. Similarly, the terms "upper" and "lower" denote relative positions in the selected orientation are for purposes of illustration. In fact, the examples used throughout this disclosure denote one selected orientation. In the described examples, however, the selected orientation is arbitrary and other orientations are possible (e.g., upside down, rotated by 90 degrees, etc.) within the scope of the present disclosure.

Described above are examples of the subject disclosure. It is, of course, not possible to describe every conceivable combination of components or methodologies for purposes of describing the subject disclosure, but one of ordinary skill in the art may recognize that many further combinations and permutations of the subject disclosure are possible. Accordingly, the subject disclosure is intended to embrace all such alterations, modifications and variations that fall within the spirit and scope of the appended claims. In addition, where the disclosure or claims recite "a," "an," "a first," or "another" element, or the equivalent thereof, it should be interpreted to include one or more than one such element, neither requiring nor excluding two or more such elements. Furthermore, to the extent that the term "includes" is used in either the detailed description or the claims, such term is intended to be inclusive in a manner similar to the term "comprising" as "comprising" is interpreted when employed as a transitional word in a claim. Finally, the term "based on" is interpreted to mean at least based in part.

What is claimed is:

1. A solid state cooler device comprising:
   a first superconductor shunt;
   a first normal metal pad disposed on the first superconductor shunt;
   a first insulator layer and a second insulator layer disposed on the normal metal pad and separated from one another by a gap;
   a first superconductor pad disposed on the first insulator layer and a second superconductor pad disposed on the second insulator layer;
   a first conductive pad coupled to the first superconductor pad, and a second conductive pad coupled to the second superconductor pad; and
   wherein hot electrons are removed from the first normal metal pad when a bias voltage is applied between the first conductive pad and the second conductive pad, the first superconductor shunt facilitating even current distribution through the device.

2. The solid state cooler device of claim 1, wherein each the first conductive pad and the second conductive pad are formed of a normal metal and function as quasi-particle traps.

3. The solid state cooler device of claim 1, further comprising a second superconductor shunt disposed on the first conductive pad, and a third superconductor shunt disposed on the second conductive pad, wherein hot electrons are removed from the first normal metal pad when a bias voltage is applied between the second superconductor shunt and the third superconductor shunt, the second superconductor shunt providing even current distribution through the first conductive pad, and the third superconductor shunt providing even current distribution through the second conductive pad.

4. The solid state cooler device of claim 3, wherein the first conductive pad is coupled to the first superconductor pad by a first set of conductive contacts, and the second conductive pad is coupled to the second superconductor pad by a second set of conductive contacts, the second superconductor shunt providing even current distribution through the first set of conductive contacts and the third superconductor shunt providing even current distribution through the second set of conductive contacts.

5. The solid state cooler device of claim 4, wherein the first superconductor shunt is disposed on or in a first substrate and the second and third superconductor shunts are disposed on or in a second substrate.

6. The solid state cooler device of claim 5, wherein the first and second set of conductive contacts are bump bonds, such that the bump bonds bond the first substrate to the second substrate.

7. The solid state cooler device of claim 5, wherein a temperature sensor is disposed on a side of the first substrate opposite the side of the first superconductor shunt.

8. The solid state cooler device of claim 1, further comprising:
   a second superconductor shunt wherein the first superconductor shunt and the second superconductor shunt are disposed on or in a first substrate and separated from one another by a gap;
   a second normal metal pad disposed on the second superconductor shunt;
   a third insulator layer and a fourth insulator layer disposed on the second normal metal pad and separated by a gap;
   a third superconductor pad disposed on the third insulator layer and a fourth superconductor pad disposed on the fourth insulator layer, wherein a first end of the second conductive pad is coupled to the second superconductor pad, and a second end of the second conductive pad is coupled to the third superconductor pad; and
   a third conductive pad coupled to the fourth superconductor pad.

9. The solid state cooler device of claim 8, further comprising a third superconductor shunt disposed on the first conductive pad, a fourth superconductor shunt disposed on the second conductive pad, and a fifth superconductor shunt disposed on the third conductive pad, wherein hot electrons are removed from the first normal metal pad and the second normal metal pad when a bias voltage is applied between the third superconductor shunt and the fifth superconductor shunt, the third superconductor shunt providing even current distribution through the first conductive pad, the fourth superconductor shunt providing even current distribution through the second conductive pad, and the fifth superconductor shunt providing even current distribution through the third conductive pad.

10. The solid state cooler device of claim 9, further comprising a first terminal coupled to an end of the third superconductor shunt, and a second terminal coupled to the fifth superconductor shunt, wherein hot electrons are removed from the first normal metal pad and the second normal metal pad when the bias voltage is applied between the first terminal and the second terminal.

11. A refrigeration system comprising a plurality of refrigeration stages, wherein a last stage comprises a refrigeration container and a plurality of solid state cooler devices as claimed in claim 1 disposed about the refrigeration container.

12. A method of fabricating a solid state cooler device, the method comprising:
forming a first superconductor shunt on or in a first substrate;
forming a first normal metal pad over the first superconductor shunt;
forming an insulator layer over the first normal metal pad;
forming a superconductor layer over the insulator layer;
forming a patterned mask over the superconductor layer;
performing an etch process to remove portions of the superconductor layer, and the insulator layer based on the patterned mask to form a first normal metal-insulator-superconductor (NIS) junction that incudes the first normal metal pad, a first insulator layer overlying the first normal metal pad, and a first superconductor pad overlying the first insulator layer, and a second NIS junction that includes the first normal metal pad, a second insulator layer overlying the first normal metal pad, and a second superconductor pad overlying the second insulator layer, wherein the first and second NIS junctions are separated from one another by a gap.

13. The method of claim 12, further comprising:
coupling a first conductive pad to the first superconductor pad; and
coupling a second conductive pad to the second superconductor pad.

14. The method of claim 12, further comprising forming a second superconductor shunt disposed on the first conductive pad, and forming a third superconductor shunt disposed on the second conductive pad, wherein hot electrons are removed from the first normal metal pad when a bias voltage is applied between the second superconductor shunt and the third superconductor shunt, the second superconductor shunt providing even current distribution through the first conductive pad and the third superconductor shunt providing even current distribution through the second conductive pad.

15. The method of claim 14, further comprising:
forming a first set of conductive contacts on one of the first superconductor pad and the first conductive pad;
forming a second set of conductive contacts on one of the second superconductive pad and the second conductive pad;
coupling the first superconductor pad to the first conductive pad via the first set of conductive contacts and coupling the second superconductor pad to the second conductive pad via the second set of conductive contacts.

16. The method of claim 15, wherein the first conductive pad and the second conductive pad are disposed in or on a second substrate.

17. The method of claim 15, wherein the first and second set of conductive contacts are bump bonds, such that the bump bonds bond the first substrate to the second substrate.

18. The method of claim 12, further comprising:
forming a second superconductor shunt wherein the first superconductor shunt and the second superconductor shunt are disposed on or in a first substrate and separated from one another by a gap;
forming a second normal metal pad disposed on the second superconductor shunt;
wherein the etch process forms a third insulator layer and a fourth insulator layer disposed on the second normal metal pad separated by a gap, and forms a third superconductor pad overlying the third insulator layer and a fourth superconductor pad overlying the fourth insulator layer;
coupling the second conductive pad to the third superconductor pad, wherein a first end of the second conductive pad is coupled to the second superconductor pad, and a second end of the second conductive pad is coupled to the third superconductor pad; and
coupling a third conductive pad to the fourth superconductor pad.

19. The method of claim 18, further comprising:
forming a third superconductor shunt disposed on the first conductive pad;
forming a fourth superconductor shunt disposed on the second conductive pad;
forming a fifth superconductor shunt disposed on the third conductive pad, wherein hot electrons are removed from the first normal metal pad and the second normal metal pad when a bias voltage is applied between the third superconductor shunt and the fifth superconductor shunt, the third superconductor shunt providing even current distribution through the first conductive pad, the fourth superconductor shunt providing even current distribution through the second conductive pad, and the fifth superconductor shunt providing even current distribution through the third conductive pad.

20. The method of claim 19, further comprising forming a first terminal coupled to an end of the third superconductor shunt, and forming a second terminal coupled to an end of the fifth superconductor shunt, wherein hot electrons are removed from the first normal metal pad and the second normal metal pad when the bias voltage is applied between the first terminal and the second terminal.

* * * * *